(12) United States Patent
Cohn et al.

(10) Patent No.: US 8,230,378 B2
(45) Date of Patent: Jul. 24, 2012

(54) METHOD FOR IC WIRING YIELD OPTIMIZATION, INCLUDING WIRE WIDENING DURING AND AFTER ROUTING

(75) Inventors: John M. Cohn, Richmond, VT (US); Jason D. Hibbeler, Williston, VT (US); Gustavo E. Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 12/572,297

(22) Filed: Oct. 2, 2009

(65) Prior Publication Data

US 2010/0023913 A1 Jan. 28, 2010

Related U.S. Application Data

(62) Division of application No. 11/275,076, filed on Dec. 8, 2005, now Pat. No. 7,657,859.

(51) Int. Cl.
*G06F 17/50* (2006.01)
(52) U.S. Cl. .......................... 716/129; 716/126; 716/130
(58) Field of Classification Search .................. 716/126, 716/129, 130
See application file for complete search history.

(56) References Cited

U.S. PATENT DOCUMENTS

| | | | |
|---|---|---|---|
| 6,202,196 B1 | 3/2001 | Huang et al. | |
| 6,305,004 B1 | 10/2001 | Tellez et al. | |
| 6,415,422 B1* | 7/2002 | Mehrotra et al. | 716/115 |
| 6,543,035 B2 | 4/2003 | Ohba et al. | |
| 6,892,371 B1 | 5/2005 | Teig et al. | |
| 6,934,924 B2 | 8/2005 | Paul et al. | |
| 7,064,043 B1 | 6/2006 | Rouse | |
| 7,114,142 B1 | 9/2006 | Segal et al. | |
| 7,185,305 B1 | 2/2007 | Rodman | |
| 7,386,815 B2 | 6/2008 | Bickford et al. | |
| 7,415,687 B2 | 8/2008 | Lahner et al. | |
| 2003/0023938 A1 | 1/2003 | Nagasaka et al. | |
| 2003/0051217 A1 | 3/2003 | Cheng | |
| 2003/0097228 A1* | 5/2003 | Satya et al. | 702/82 |
| 2004/0243953 A1 | 12/2004 | Ramachandran et al. | |
| 2004/0250230 A1 | 12/2004 | Itou et al. | |
| 2005/0151258 A1* | 7/2005 | Kotecha et al. | 257/758 |
| 2005/0289494 A1 | 12/2005 | Kozhaya et al. | |

* cited by examiner

*Primary Examiner* — Vuthe Siek
(74) *Attorney, Agent, or Firm* — Gibb I.P. Law Firm, LLC

(57) ABSTRACT

Disclosed are embodiments of a method, service, and computer program product for performing yield-aware IC routing for a design. The method performs an initial global routing which satisfies wiring congestion constraints. Next, the method performs wire spreading and wire widening on the global route, layer by layer, based on, for example, a quadratic congestion optimization. Following this, timing closure is performed on the global route using results of the wire spreading and wire widening. Post-routing wiring width and wire spreading adjustments are made using the critical area yield model. In addition, the method allows for the optimization of already-routed data.

15 Claims, 4 Drawing Sheets

- $w$: width
- $s$: space
- $p$: pitch; $p = w + s$, fixed
- $L$: length
- $K_{short}$ : defect density for shorts
- $K_{open}$ : defect density for opens

- $w$: width
- $s$: space
- $p$: pitch; $p = w + s$; fixed
- $L$: length
- $K_{short}$ : defect density for shorts
- $K_{open}$ : defect density for opens

METHOD FOR IC WIRING YIELD OPTIMIZATION, INCLUDING WIRE WIDENING DURING AND AFTER ROUTING

CROSS-REFERENCE TO RELATED APPLICATIONS

This application is a divisional of U.S. Pat. No. 7,657,859, issued on Feb. 2, 2010, the complete disclosure of which, in its entirety, is herein incorporated by reference.

BACKGROUND OF THE INVENTION

1. Field of the Invention

Embodiments herein present a method, service, computer program product, etc. for performing yield-aware IC routing for a design.

2. Description of the Related Art

Traditional methods for decreasing critical area (and so increasing random-defect yield) in the wiring layers of a VLSI (very large scale integration) layouts control wire spacing, reduce isolated via counts and reduce overall wire length, either during routing or as a post-routing step. Wire spreading (increasing the space between individual wires) reduces the likelihood of spot defects falling between wires and producing shorts; wire-length minimization reduces both the likelihood of spot defects that cause opens and those that cause shorts; and redundant via insertion reduces the likelihood that blocked vias will result in fatal (yield reducing) defects.

Thus, the conventional way to affect random-defect opens is by reducing overall wire length. In a dual-damascene manufacturing process, the incidence of wiring opens is much more significant than in previous technologies. There is a clear need for more effective techniques to reduce the likelihood of opens.

SUMMARY OF THE INVENTION

Embodiments herein present a method, service, computer program product, etc. for performing yield-aware IC routing for a design. The method performs an initial global routing which satisfies wiring congestion constraints. Next, the method performs wire spreading and wire widening on the global routing, layer by layer, based on, for example, a quadratic congestion optimization. Following this, timing closure is performed on the global routing using results of the wire spreading and wire widening. Post-routing wiring width and wire spreading adjustments are then made using the critical-area yield model.

When making the post-routing wiring width adjustments, the method creates modified wiring widths and modified spacing between wires. The making of the post-routing wiring width and length adjustments balances trade-offs between wire widths and wire spacings. The making of the post-routing wiring width and length adjustments avoids altering relative locations of the wiring routes.

Thus, embodiments herein design initial wiring routes within an integrated circuit design, which establishes initial wiring widths, and initial shapes and locations of the wiring routes. When adjusting the initial wiring widths, the method produces modified wiring routes. In one embodiment, only the wiring widths are modified and the modified wiring routes maintain the initial shapes and relative locations of the wiring routes. In alternative embodiments, the method adjusts the initial wiring widths and adjusts the spacing between the wiring routes to produce modified wiring routes. In both embodiments, the method performs an optimization process on the modified wiring routes that selects a final wiring route that produces an optimized yield.

The optimization process comprises estimating a likelihood of random defects and calculating random-defect yield based on the likelihood of random defects. The adjusting of the initial wiring widths creates modified wiring widths and the estimating of the likelihood of random defects is based upon the modified wiring widths. The optimization process balances trade-offs between wire widths and wire spacings. The adjusting and the optimization process are performed incrementally for different layers of the integrated circuit design.

To model random-defect yield accurately, the invention uses the concept of critical-area Analysis (CAA), S. Gandemer, B. C. Tremintin, and J. J. Charlot, "Critical area and critical levels calculations in IC yield modeling," IEEE J. Solid-State Circuits, Vol. 35, No. 3, pp. 158-166, February 1988. Critical area is a mathematical measure of the sensitivity of a VLSI layout to random defects. The critical area model accounts for shorts, which bridge layout shapes in different electrical nets; opens, which cut through a shape thereby creating an electrical open; and via blocks, which block the flow of current through an inter-layer connection. The wiring-optimization techniques presented in this disclosure treat shorts and opens.

More specifically, the following describes a global routing method that optimizes wire widths and spacings for yield, while accomplishing the tasks of timing closure and signal integrity. In a post-routing optimization step, the invention derives cost functions associated with wire widths, lengths and spacings and forms constraints to represent design rules and connectivity. The invention then optimizes while maintaining existing topological relationships (for example, vias can be moved without re-routing wires). The result is a set of wires with adjusted widths and spacings such that the overall critical area of the design is reduced. The post-routing optimization step can be used on its own, without the global routing solution. Thus, it allows for some yield optimization, regardless of the routing technology that might have been used to route the design.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
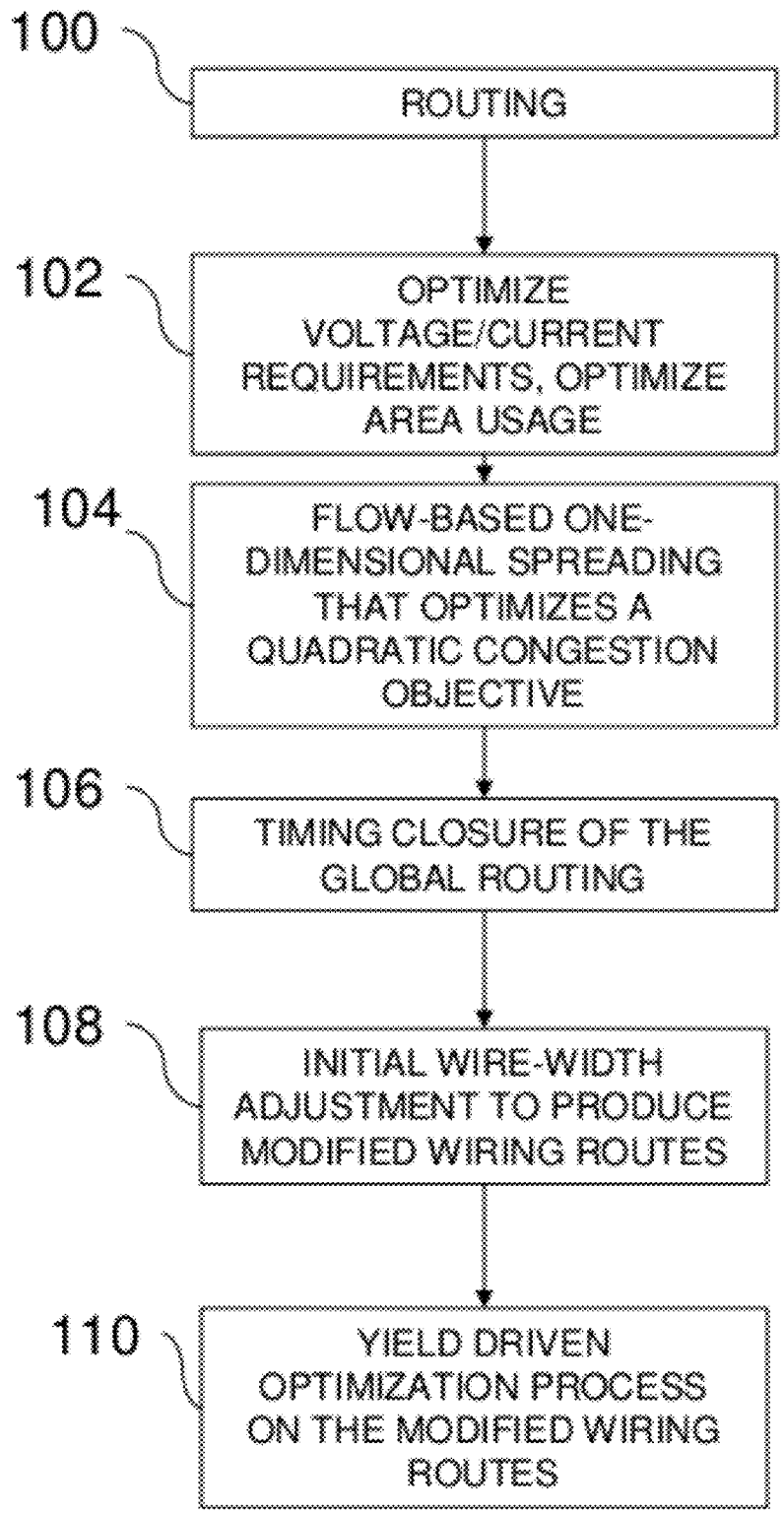
FIG. 1 is a flow diagram illustrating a preferred method of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, there is a clear need for more effective techniques to reduce the likelihood of opens (unintentionally broken circuits). The embodiments herein modify the wire widths in a layout to achieve a reduction in the likelihood of opens. While wire-width control is a standard part of automatic routing, routers have traditionally picked wire widths for reasons of signal integrity and not for yield. Furthermore, routers tend to avoid the use of wide wires because mixed-width wiring generally causes a more difficult routing problem. In general, routers will not increase the widths of wires for yield enhancement. Conventional tools do not perform post-routing wire-width adjustment for yield optimization, as the primary focus in the past has been on wire spreading and redundant-via insertion.

The modifications necessary for treating opens and shorts for yield optimization are conflicting: by spreading wires, and the spacing is increased and there may be an overall increase in wire length; and by widening wires the spacing is reduced. This disclosure presents a model that takes into account the wire width versus wire spacing yield trade-offs, which is then used to develop methods to do yield optimization that adjust wire widths and/or spacings.

To model random-defect yield accurately, the invention uses the concept of critical area, which is described in greater detail below. Ultimately, the invention uses the critical-area model to guide the adjustment of wire widths and spaces. More specifically, the following describes a global routing method that optimizes wire widths and spacings for yield, while accomplishing the tasks of timing closure and signal integrity. This invention is made with the understanding that the detailed router will follow the basic routing paths, layers and widths selected by the global router. In a post-routing optimization step, the invention derives cost functions associated with wire widths, lengths and spacings and forms constraints to represent design rules and connectivity. The invention then optimizes while maintaining existing topological relationships (for example, vias can be moved without re-routing wires). The result is a set of wires with adjusted widths and spacings such that the overall critical area of the design is reduced. The post-routing optimization step can be used on its own, without the global routing solution. Thus it allows for some yield optimization, regardless of the routing technology that might have been used to route the design.

More specifically, referring out to the drawings, FIG. 1 illustrates one embodiment of the invention. More specifically, FIG. 1 illustrates an embodiment for the design of initial wiring routes within an integrated circuit. In item 100, the method begins by performing an initial (three-dimensional) global routing for designing the initial wiring routes that satisfies congestion constraints. This process 100 establishes initial wiring widths, and initial shapes and locations of the wiring routes. Then, other activities such as making adjustments to optimize voltage/current requirements, optimize area usage (item 102), etc. are performed. In item 104, the invention performs a flow-based one-dimensional spreading that optimizes, for example, a quadratic congestion objective. Item 106 represents the timing closure of the global routing.

Then, in item 108, the method adjusts the initial wiring widths to produce modified wiring routes. In this embodiment, only the wiring widths are modified and the modified wiring routes maintain their initial shapes and relative locations. In other words, this embodiment involves post-routing wire-width adjustment to optimize yield. The method then performs a yield-driven optimization process (item 110) on the modified wiring routes that selects a final wiring route that produces an optimized yield.

Figure 2:
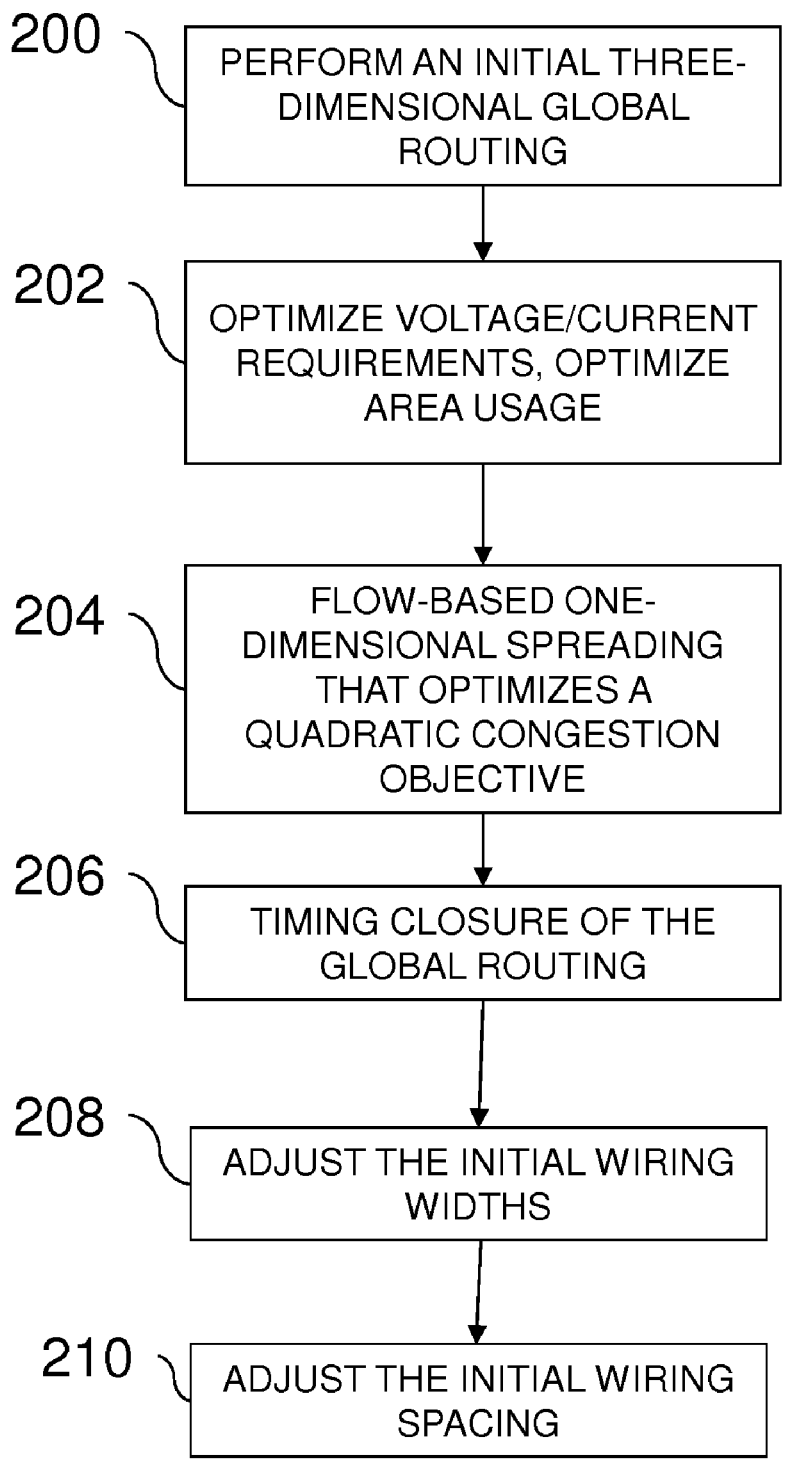
FIG. 2 is a flow diagram illustrating a preferred method of the invention.

In alternative embodiments, the method adjusts the initial wiring widths and adjusts the spacing between the wiring routes to produce modified wiring routes. One such embodiment is shown in FIG. 2. More specifically in item 200, the method begins by designing the initial wiring routes, which establishes initial wiring widths, and initial shapes and locations of the wiring routes. Then, other activities such as making adjustments to optimize voltage/current requirements, optimize area usage (item 202), etc. are performed. In item 204, the invention performs a flow-based one-dimensional spreading that optimizes, for example, a quadratic congestion objective. Item 206 represents the timing closure of the global routing. Then, in item 208, the method adjusts the initial wiring widths. Then, in item 210, the method adjusts the initial wiring spacing. Steps 208 and 210 produce the modified wiring routes. In this embodiment, only the wiring widths and the spacing between the wires are modified, again without changing wiring shapes or locations. In other words, this embodiment involves wire-width and wire spacing adjustment to optimize yield during the routing process. The method then performs a yield driven optimization process (item 212) on the modified wiring routes that selects a final wiring route that produces an optimized yield.

The adjusting of the initial wiring widths (item 208) creates modified wiring widths and in the adjusting of the initial wiring spacing (item 210) creates modified wiring spacings. The adjusting and the optimization process can be performed incrementally for different levels of the integrated circuit design. Thus, embodiments herein present a method that performs an initial global routing (200) which satisfies wiring congestion constraints. As part of the global routing (200), the method performs wire spreading and wire widening on the global route (layer by layer) based on, for example, a quadratic congestion optimization. Timing closure (206) is performed on the global route using results of the wire spreading and wire widening. Post-routing wiring width and wire spreading (208) adjustments are made using an optimization based on the critical area yield model. The wiring width and spacing adjustments balance trade-offs between wire widths and wire spacings.

There are many approaches to global routing (200). The basic mathematical formulation for global routing uses a multi-commodity flows-based method, using a linear objective. This formulation can be extended using the objective function as shown in FIG. 2. In the embodiment shown in FIG. 1, a complete initial global routing is performed by whatever method is preferred, and then the yield objective is optimized, one layer at a time. The embodiment shown in FIG. 1 has the benefit of being easily parallelizable and does not require path searches.

Figure 3:
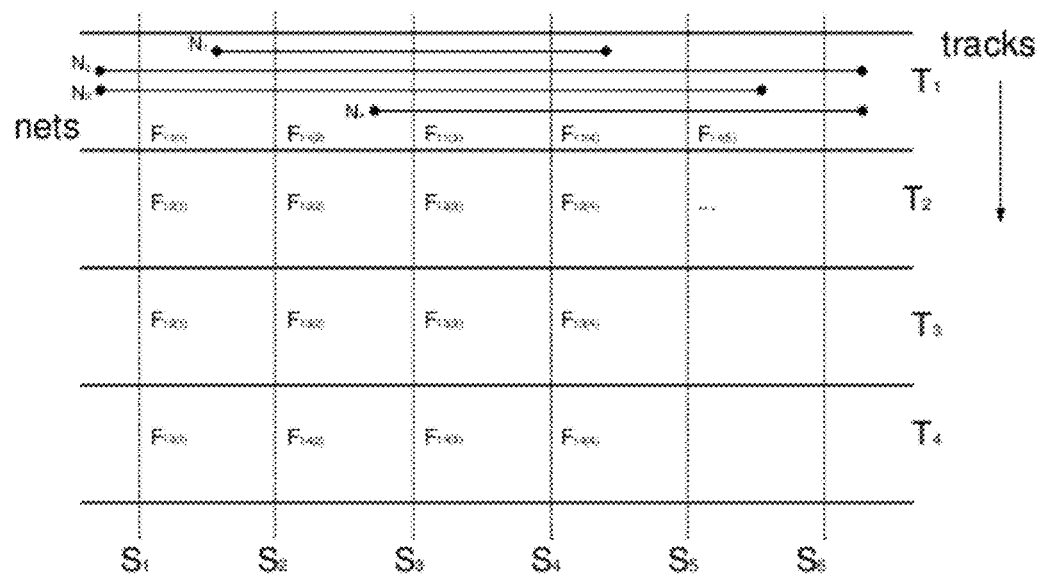
FIG. 3 is a schematic diagram illustrating a flows problem.

Thus, for example, the embodiment shown in FIG. 2 can use a formulation based on a simplified multi-commodity flows problem as shown in FIG. 3. This formulation can assign a single commodity for each net Ni, and the problem is to find a flow for that commodity throughout the interval of the wire of that net on the layer of interest in FIG. 3. A track is defined as a row of global cells. Since the net can be routed on any of the global cells, for each net Ni and global cell Tk, a flow variable Fik is created. To guide the track assignment, for each net Ni there is a cost of routing on each track Tk, denoted Wik. The objective of the optimization is:

Minimize ΣAik*Fik+ΣSk*(ΣFik)²

The linear weight Aik and the quadratic weight Sk are selected to optimally trade-off the contributions of wire length and spacing to yield. The quadratic term penalizes the total congestion of each track, and directly causes the spreading of congestion. The values for these two constants are derived from the Fshorts and Fopens functions shown in the following description.

The assignment of a net Ni to a track Tk is modeled as a [0,1] variable. Thus if net Ni is to be assigned to track Tk, then Fik=1, otherwise Fik=0. This introduces the constraints:

C1) 0<=Fik<=1, and
C2) Fik is an integer

Since a single segment of a net is routed at one time, then the number flows per net may not exceed 1. This gives rise to the mass balance constraint for each net Ni:

C3) ΣFik=1 for each net Ni

For every track Tk, at each slot Sj, only the number of nets assigned to a track may not exceed the capacity of the track. This gives rise to the bundle constraints:

C4) 0<=ΣWi*Fik<=Ck, for every slot Sj, every track Tk, and every net Ni with width Wi.

In general, there is a set of Fik for each slot Sj; and it could be written Fik(j). This model limits the solution in that a net is constrained to be assigned to a single track. The design of the successive routing stages is intended to solve the traditional problems addressed by global routing, and then in conjunction optimize the resulting wiring for yield. Both wire spreading and wire widening are taken into account. The post-routing optimization step for wire-size adjustment discussed above can be implemented in many different manners. One example of the optimization is discussed below. Using a compaction-based layout optimizer, the method can scan the wiring and blockage shapes in the layout in one direction. For wires perpendicular to this direction, width and space will be modified; for wires parallel to this scan direction, length will be modified.

Then predefined jog points can be built in the wires that are allowed to be modified. These jog points are places where wrong-way wire segments will be inserted. Constraints can be formed between edges to represent ground rules. Principally, spacing and width rules should be enforced during the optimization. Constraints can be formed between edges and between layout objects (wires, vias, pins) to maintain electrical connectivity. Also, other constraints can be formed representing methodological requirements (frozen nets, pin constraints, etc.).

Figure 4:
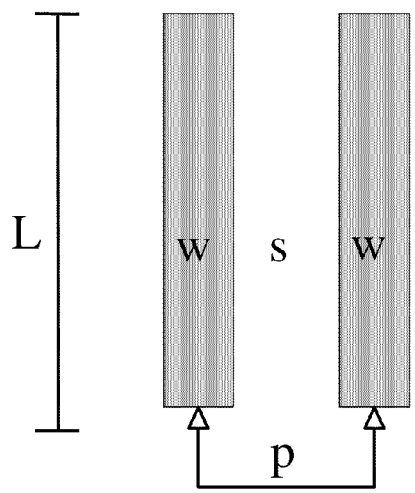
FIG. 4 is a schematic diagram of parallel wires.

For each wire segment perpendicular to the scan direction, the method forms objectives between pairs of edges to model critical area. For a single pair of wires 40 without any nearby wires and a given wiring pitch (p), the width (w) and spacing (s) of the wires can be set as shown in FIG. 4. In FIG. 4, let the first-order estimate of the critical area of these two wires be C(s, w)

Then $C(s, w) = K_{short}L/s + K_{open}L/w$ $= K_{short}L/(p-w) + K_{open}L/w$

And C(s, w) is minimized when
W=p/[1+sqrt($K_{short}/K_{open}$)]

Here, $K_{short}$ is a constant representing the defect density for shorts for wires on the layer in question, and $K_{open}$ is the defect density for opens for wires on that layer. These constants are specific to the fabrication process in which the design will be manufactured. For a group of parallel wires between two fixed objects, a similar equation can be derived for width and space. To model the critical area associated with wire length, a simple linear function can be used.

All cost functions are combined, using the weighting factors and the constraints described above and optimized. The cost functions and constraints are all piecewise linear functions, and so a piecewise linear constrained optimization routine can be used. Alternatively, the cost functions and constraints can be reduced to linear form, and a standard linear programming package can be used. Then, the processing can be repeated in the perpendicular direction.

With respect to the modeling of random defect yield during global routing that is mentioned above, this portion of the disclosure describes a costing function and methods that would guide global routing algorithms. Such objectives would guide the algorithm in finding paths of locally optimum yield. These objectives are then used in a flows method for spreading wires during global routing.

The principle of this objective is based on an estimation of critical area. Critical area is a well known metric used to estimate the likelihood of random defects in a layout of an integrated circuit (IC).

Critical area analysis can be used to estimate layout yields as follows:

1. Compute the probability of fault due to the likelihood of a fault occurring to a shape, or between shapes due to some fault mechanism.
2. Multiply the probability of fault against a fault defect density fab constant, to produce a fault estimate. The fault quantity is proportional to the logarithm of the yield. This quantity is also called the average fault.
3. The average faults due to shorts between a set of parallel wires of width W, with a parallel run of length L, and spaced by a distance S is:

$$F_{short} = (K_{short})(L)\left(\frac{1}{S} - \frac{1}{2S+W}\right)$$

4. The average faults due to opens the same set of wires is:

$$F_{open} = (K_{open})(L)\left(\frac{1}{W} - \frac{1}{2W+S}\right)$$

5. The average faults due to missing/blocked vias can be approximated by a constant per via. This constant would be smaller depending on whether the via might be redundant, i.e. be constructed with multiple "cuts".
6. The total average faults is the sum of faults due to all defect mechanisms.
7. An estimate of yield can be obtained using the negative binomial approximation equation on the total faults:

$$Y = (Y_0)\left(1 + \frac{F_{total}}{\alpha}\right)^{-\alpha}$$

The total fault metric, $F_{total}$, is a predictor of yield and has been found to be useful in layout optimization. This function can be simplified to simplify its use and computation, such that the total fault metric is a function only of the width (W) and length of the wire (L), the common run length with adjacent wire (Lc), and the spacing with the adjacent wire (S). Note that Lc and L are the same in this function. The resulting function for $F_{total}$ is:

$$F_{total} = K_{short} \sum \frac{L}{S} + K_{open} \sum \frac{L}{W} + K_{via} N_{via}$$

The constant $K_{via}$ is the probability that a single (i.e., non-redundant) via will not be manufactured correctly; and $N_{via}$ is the number of single vias in the wiring being considered. Furthermore, when optimized, the total faults metric provides a balance between wire length and adjacency reduction, and thus is a simple, first order metric for capacitance reduction. In the application of capacitance reduction, a more accurate model would adjust the constants K, to compensate for up and down capacitance, by measuring the average density of wiring in the upper and lower routing planes. A further adjustment might be that the lateral capacitance component may be proportional to some power of 1/S, and may vanish if S is large enough.

For noise reduction and targeted capacitance reduction, the $F_{total}$ function could be modified to include only the components of "bad" capacitance, by adjusting the K constants based on net adjacency information. Since the capacitance reduction in general reduces noise and improves performance, the techniques described herein have the side benefit of aiding performance in addition to increasing manufacturing yield.

The following describes the extensions to a tile-based router that would allow for finding paths that minimize the $F_{total}$ metric.

The base global routing algorithm includes the following steps:

1. Divide the routing region into tiles (global routing cells, or "gcells"),
2. Compute the routing capacity within and between the gcells,
3. Route the nets, through the gcells, while satisfying capacity constraints,
4. The router objective is, typically to minimize wire length and via counts.

The global routing that results has one feature: since the gcells abstract arbitrarily large areas of the chip, a global router cannot consider issues of blockages and net-to-net blockages directly. Instead it focuses on almost-legal path finding. For these reasons global routing is known to be a fast process.

The rest of this section describes extensions to the global routing problem that are intended to optimize the faults ($F_{total}$) metric. The opens portion of the faults objective is seen to be equivalent to the wire-length and via count minimization objective. The shorts objective, however is not well represented. The following model incorporates this portion of the yield objective.

The shorts portion of the yield objective is a function of a common run L and the spacing between S between wires. The common run L can be estimated in a global route as being the wire length of the wire. The spacing between wires can be as small as the minimum clearance rule. If all wires were to be packed at minimum spacing, then the shorts yield objective is proportional to the wire length, and thus the wire-length global routing is sufficient. The largest wire spacing, however, is a function of the congestion of the area where the wire is routed. Given n wires of width w, within a gcell of width $W_g$, the maximum space ($S_{max}$) between these wires is:

$$S_{max} = \frac{W_g - nw}{n+1},$$

therefore the minimum faults contributed by the all wires routed within this gcell is:

$$F_{short}(gcell) = K_{short} \sum_n \frac{L}{S_{max}} = K_{short} \frac{W_g(n+1)n}{W_g - nw}.$$

For comparison, the faults cost due to opens when routing n nets thru a gcell is:

$$F_{open}(gcell) = K_{open} \sum_n \frac{L}{w} = K_{open} \frac{W_g n}{w}.$$

The complete fault-based objective would then be:

$$F_{total}(gcell) = F_{short}(gcell) + F_{open}(gcell).$$

Unlike the linear cost, the cost of routing through a gcell using the faults metric now depends on how many routes are already within the gcell. An advantage of this objective is that it includes the original linear cost, and thus by adjusting $K_{shors}$ and $K_{open}$, the adjustment of wire-spreading vs. wire-length tradeoffs at a global level is possible. Another feature of this cost is that it naturally penalizes over-congestion: note that the objective becomes infinite at $nw = W_g$, which is where the sum of the wire widths within the gcell equals the width of the gcell.

To model random-defect yield accurately, the invention uses the concept of critical area. Ultimately, the invention performs an optimization based on a critical area model to adjust wire widths and spaces before or after routing. More specifically, the following describes a global routing method that optimizes wire widths and spacings for yield, while accomplishing the tasks of timing closure and signal integrity. In a post-routing optimization step, the invention derives cost functions associated with wire widths, lengths and spacings and forms constraints to represent design rules and connectivity. The invention then optimizes while maintaining existing topological relationships (for example, vias can be moved without re-routing wires). The result is a set of wires with adjusted widths and spacings such that the overall critical area of the design is optimized. The post-routing optimization step can be used on its own, without the global routing solution. Thus it allows for some yield optimization, regardless of the routing technology that might have been used to route the design.

The invention integrates manufacturing-yield awareness into the global routing step, allowing routes to be placed so that wirings shorts and opens are reduced. The invention allows wiring in design that have already been routed to be optimized for random-defect shorts and opens. In both of these cases, the invention allows an explicit trade-off between sensitivity to shorts and to opens to be made either during routing or after routing is complete.

While the invention has been described in terms of preferred embodiments, those skilled in the art will recognize that the invention can be practiced with modification within the spirit and scope of the appended claims.

What is claimed is:

1. A method of performing integrated circuit routing for a design, comprising:
   performing, by a computer, an initial global routing which satisfies wiring congestion constraints to produce a global route;
   performing, by said computer, wire spreading and wire widening on said global route layer-by-layer, said performing of said wire spreading and wire widening being based on a first optimization process comprising a quadratic congestion optimization process and said quadratic congestion optimization process comprising balancing trade-offs in contributions of wire length and wire spacings to yield;
   performing, by said computer, timing closure on said global route using results of said wire spreading and wire widening; and
   making, by said computer, post-routing wiring width and wire spreading adjustments using a second optimization process, said second optimization process being based on a critical-area model in order to reduce random defects.

2. The method according to claim 1, said initial global routing comprising a three-dimensional routing process.

3. The method according to claim 1,
   said making of said post-routing wiring width and wire spreading adjustments comprising creating modified wiring widths and modified spacing between wires, and
   said using of said second optimization process that is based on said critical area model comprising calculating, by said computer, a likelihood of said random defects based upon said modified wiring widths and said modified spacing between wires.

4. The method according to claim 1, said making of said post-routing wiring width and wire spreading adjustments comprising balancing trade-offs between wire widths and said wire spacings to reduce said random defects.

5. The method according to claim 1, said making of said post-routing wiring width and wire spreading adjustments comprising avoiding altering shapes and relative locations of wiring routes within said global route.

6. A method of performing integrated circuit routing for a design, comprising:
   performing, by a computer, an initial global routing which satisfies wiring congestion constraints using a computer to produce a global route, said performing of said initial global routing comprising establishing initial wiring widths and spacings and further establishes initial shapes and locations of said global route;
   performing, by said computer, wire spreading and wire widening on said global route layer-by-layer to produce a modified global route that maintains said initial shapes and locations of said initial global route such that topical relationships in said initial global route and said modified global route are the same, said performing of said wire spreading and wire widening being based on a first optimization process, said first optimization process comprising a quadratic congestion optimization process, and said quadratic congestion optimization process comprising balancing trade-offs in contributions of wire length and wire spacings to yield;
   performing, by said computer, timing closure on said modified global route; and
   making, by said computer, post-routing wiring width and wire spreading adjustments using a second optimization process, said second optimization process being based on a critical-area model to reduce random defects.

7. The method according to claim 6, said initial global routing comprising a three-dimensional routing process.

8. The method according to claim 6,
   said making of said post-routing wiring width and wire spreading adjustments comprising creating modified wiring widths and modified spacing between wires, and
   said using of said second optimization process that is based on said critical area model comprising calculating, by said computer, a likelihood of said random defects based upon said modified wiring widths and said modified spacing between wires.

9. The method according to claim 6, said making of said post-routing wiring width and wire spreading adjustments comprising balancing trade-offs between wire widths and said wire spacings to reduce said random defects.

10. The method according to claim 6, said making of said post-routing wiring width and wire spreading adjustments comprising avoiding altering shapes and relative locations of wiring routes in said global route.

11. A method of performing integrated circuit routing for a design, comprising:
    performing, by a computer, an initial global routing which satisfies wiring congestion constraints using a computer to produce a global route, said performing of said initial global routing comprising: establishing initial wiring widths and spacings; establishing initial shapes and locations of said global route; and satisfying at least routing congestion constraints;
    performing, by said computer, wire spreading and wire widening on said global route layer-by-layer to produce a modified global route that maintains said initial shapes and locations of said initial global route such that topical relationships in said initial global route and said modified global route are the same, said performing of said wire spreading and wire widening being based on a first optimization process, said first optimization process comprising a quadratic congestion optimization, and said quadratic congestion optimization process comprising balancing trade-offs in contributions of wire length and wire spacings to yield;
    performing, by said computer, timing closure on said modified global route; and
    making, by said computer, post-routing wiring width and wire spreading adjustments using a second optimization, said second optimization process being based on a critical-area model that selects a final global route having a reduced critical area relative to an initial critical area to reduce random defects such that said final global route produces an optimized yield.

12. The method according to claim 11, said initial global routing comprising a three-dimensional routing process.

13. The method according to claim 11,
    said making of said post-routing wiring width and wire spreading adjustments comprising creating modified wiring widths and modified spacing between wires, and
    said using of said second optimization process that is based on said critical area model comprising calculating, by said computer, a likelihood of said random defects based upon said modified wiring widths and said modified spacing between wires.

14. The method according to claim 11, said making of said post-routing wiring width and wire spreading adjustments comprising balancing trade-offs between wire widths and said wire spacings to reduce said random defects.

15. The method according to claim 11, said making of said post-routing wiring width and wire spreading adjustments comprising avoiding altering shapes and relative locations of wiring routes in said global route.

* * * * *